US007023070B2

(12) United States Patent
Kato

(10) Patent No.: US 7,023,070 B2
(45) Date of Patent: Apr. 4, 2006

(54) SEMICONDUCTOR DEVICE

(75) Inventor: Katsuhiro Kato, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 42 days.

(21) Appl. No.: 10/748,255

(22) Filed: Dec. 31, 2003

(65) Prior Publication Data

US 2004/0245599 A1 Dec. 9, 2004

(30) Foreign Application Priority Data

Jun. 5, 2003 (JP) ............................ 2003/160232

(51) Int. Cl.
*H01L 21/82* (2006.01)

(52) U.S. Cl. ........................ 257/529; 257/50; 257/209; 257/210; 257/211; 257/528

(58) Field of Classification Search ................. 257/50, 257/209, 529, 737–738, 210–211, 528, 530, 257/52; 438/132, 215, 281, 467, 601, 611, 438/613

See application file for complete search history.

(56) References Cited

U.S. PATENT DOCUMENTS

2002/0014680 A1 * 2/2002 Tottori ........................ 257/529

FOREIGN PATENT DOCUMENTS

JP 05-218130 8/1993
JP 05-343407 12/1993

* cited by examiner

*Primary Examiner*—Donghee Kang
(74) *Attorney, Agent, or Firm*—Rabin & Berdo, PC

(57) ABSTRACT

The present invention prevents electrostatic discharge damage which may occur when a device chip which has a circuit with fuses mounted thereon is packaged by COG packaging, without increasing an area occupied on the device chip. The height from the chip substrate surface to the top face 138*b* of the chip terminal 103*b* formed on the chip substrate surface 136 is formed to be higher than the height from the chip substrate surface to the top face 138*a* of the fuse terminal 103*a*. By this, an electrostatic discharge occurs at the chip terminal side when packaged in a COG packaging, so an electrostatic discharge does not occur to the fuse terminal side.

8 Claims, 10 Drawing Sheets

SEMICONDUCTOR DEVICE

BACKGROUND OF THE INVENTION

1. Field of the Invention

The present invention relates to a semiconductor device, and more particularly to an external connection terminal for preventing electrostatic discharge damage.

2. Description of Related Art

Recently the use of COG (Chip On Glass) packaging, which excels in high density packaging, is rapidly spreading. In a COG package, gold bumps or solder bumps for packaging on a substrate are formed directly on the semiconductor device chip (hereafter called a "device chip"), and the bumps on the device chip are bonded with a metal wiring printed on the glass or ceramic substrate to be connected with external equipment. With such a COG packing, since the packaging area for the substrate is the same size as the device chip, extremely high density packaging is possible.

Also in the case of a semiconductor integrated circuit, represented by the so called "system LSI", such as a microcontroller and an LSI for communication, the voltage supplied from an external power supply cannot be used for operation of the semiconductor integrated circuit as is, but is used for internal operation after performing voltage adjustment. Voltage adjustment is performed by amplifying the reference voltage generated in the semiconductor integrated circuit by an operational amplifier (hereinafter called OP-amp) using the forward voltage of the diode. This voltage adjustment is performed to prevent abnormal functioning of the semiconductor integrated circuit which occurs when the supply voltage from the external power supply is unstable.

Also among these semiconductor circuits, semiconductor circuits which are particularly sensitive to reference voltage have fuse terminals for output voltage adjustment. Transistors constituting the OP-amp may have some dispersion of threshold voltage depending on the wafer or the chip. If threshold voltage changes, the amplification characteristics of the OP-amp also changes. When the output voltage of the OP-amp deviates from a desired value, the resistance value of the feedback resistance of the OP-amp is adjusted by blowing out a specific fuse, so that the output voltage becomes a predetermined value.

Today reference voltages are dropping since the driving voltages of semiconductor integrated circuits are decreasing, so the amplification characteristics of the OP-amp are becoming more easily influenced by the dispersion of threshold voltage. As a result, there is a tendency that the use of semiconductor integrated circuits, which have the above mentioned fuses, are increasing.

An example of the amplification circuit which has fuses will be described with reference to FIG. 9.

FIG. 9 (A) shows an example of a general amplification circuit using an OP-amp. The internally generated reference voltage (hereafter called "reference voltage") V0 generated in the semiconductor integrated circuit is amplified by the OP-amp 200, and is output as the reference voltage for device driving (hereafter also called "output voltage") V0', which is used for driving the semiconductor integrated circuit, for example. The output voltage V0' of the OP-amp 200 is determined by the resistance value Ri of the resistance element 202 and the resistance value Rf on the feedback resistance 204. The resistance element 202 is comprised of a fixed resistance element of which the resistance value does not change, and the feedback resistance 204 is comprised of a variable resistance element. If the output voltage V0' of the OP-amp deviates from a desired value, the output voltage V0' is adjusted by changing the resistance value Rf of the feedback resistance 204.

FIG. 9 (B) shows a circuit for resistance value adjustment of the feedback resistance 204. In the feedback resistance 204, a plurality of resistance elements (eight in this case) are connected in series. The circuit for resistance value adjustment, where PMOS is integrated, is connected to each of the plurality of resistance elements in parallel. This circuit for resistance value adjustment is connected with a reference voltage (VDD) via the inverter and the pull-up resistance elements 210*a*–210*c*, and is also connected to the ground (GND) potential via the fuses 206*a*–206*c*. The fuses 206*a*–206*c* have protective resistance elements 208*a*–208*c* respectively, for protecting the circuit for resistance value adjustment when fuses are blown out. When the fuses 206*a*–206*c* are blown out, the high level (VDD) or the low level (GND) of the signal of the voltage supplied to the PMOS changes, and the route where the current of the adjustment circuit runs changes, and the current does not run through a part of the eight resistance elements connected in series, so the resistance value Rf of the feedback resistance changes.

FIG. 10 shows a schematic of a general COG package. The device chip 230 comprises fuse terminals and chip terminals which have a protective circuit. On the surface of the device chip 230, bumps 232 of the chip terminals are arranged in a line along the edge, and a plurality of bumps 234 of the fuse terminals, which are lined up in a line, are disposed in the inner area of the bumps 232 of the chip terminals.

FIG. 11 shows an example of the protective circuit used for the chip terminal. The protective circuit is disposed between the chip terminal 212 and the internal circuit 213. Between the chip terminal 212 and the resistance element 218, a protective diode 214 connected to the reference voltage (VDD) and a protective diode 216 connected to the ground potential (GND) are disposed. The resistance element 218 is connected to the internal circuit 213 via the inverter 220. This protective circuit protects the internal circuit 213 from electrostatic discharge damage by discharging an electrostatic surge which enters the chip terminal to VDD via the protective diode 214 or to GND via the protective diode 216.

In the case of the COG package, a fuse terminal for connecting with external equipment is disposed also in a circuit which has a fuse. In a conventional resin sealing type package which has been frequently used, the fuse terminal is not led out as an external terminal to be connected with the external power supply, but is sealed in the resin. Therefore the fuse terminal does not have the protective circuit which the chip terminal has, since the fuse terminal is not exposed to static electricity.

Also in a TAB (Tape Automated Bonding) type package, it has been proposed to increase the height of bump electrodes at the outer side so as to suppress the thermal expansion of the inner leads to be connected to the bump electrodes at the inner side during thermo-compression bonding (see Japanese Patent Application Laid-Open No. 5-218130). In Japanese Patent Application Laid-Open No. 5-218130, the heights of adjacent bump electrodes are adjusted by adjusting the plating conditions, however the detailed method is not disclosed.

As another example of having bump electrodes with different heights is a method of preventing the contact of adjacent bump electrodes due to the thermal cycle by shifting the heights of the bonding face of the bump electrodes between the external substrate and the device chip (see Japanese Patent Application Laid-Open 5-343407). In Japanese Patent Application Laid-Open 5-343407, the heights of the bumps of the device chip and the external substrate to be connected are formed to be high in one and low in the other. Also the heights of the adjacent bumps on the device chip and the external substrate are formed to be different, so the heights of the bonding faces of the adjacent bumps are different, and contact between the bump electrodes is prevented.

In a conventional resin sealing type package, the fuse terminal is not led outside, so it is not exposed to electrostatic discharge damage during packaging, and does not require the protective circuit. In the COG package, bumps for connection are formed for the fuse terminal as well as the other chip terminals, so the fuse terminal is led out as a terminal to be connected to the outside. Therefore in the device chip having a fuse, electrostatic discharge damage by a charged external substrate tends to occur when it is connected with the external substrate.

As an example, FIG. 12 shows a schematic of the electrostatic discharge phenomena in the packaging step of the COG package.

On the external substrate 240 for external equipment connection, a plurality of device chips are sequentially connected. In FIG. 12, the device chip 244 is already connected to the external substrate 240. To this external substrate 240, the device chip 230 comprising a circuit, which has the fuse shown in FIG. 10, is connected. The external substrate 240 is made of glass or ceramic, so it is very easily charged. When the device chip 230 is connected to the external substrate 240, electrostatic discharge occurs in the fuse terminal 234 or the chip terminal 232. If discharge occurs to the chip terminal 232, electrostatic discharge damage does not occur since the chip terminal 232 has a protective circuit. If the electrostatic discharge 246 occurs to the fuse terminal 234, however, electrostatic discharge damage occurs. In other words, the fuse in the circuit of the semiconductor integrated circuit is blown out, and the resistance value, which has been adjusted to a desired resistance value, changes.

If a protective circuit similar to that of the chip circuit is included in the fuse terminal, the occupied area of the chip increases. This increases the chip size, which also increases chip cost. Also a general resin sealing type chip does not have a protective circuit in the fuse terminal, so it cannot be used for a COG type chip as is. Therefore it is necessary to develop a new device chip where a protective circuit is disposed in a fuse terminal.

With the foregoing in view, it is an object of the present invention to provide a semiconductor device for protecting from electrostatic discharge damage while suppressing the increase in the chip area in a packaging system for a COG package where a fuse terminal is directly connected to an external substrate for connecting with external equipment.

SUMMARY OF THE INVENTION

After the result of concentrated research, the inventor of this application reached the conclusion that static electricity being charged on the external substrate is discharged into a discharge contribution terminal of which the height is higher than the fuse terminal.

So the semiconductor device according to the present invention comprises fuse terminals provided on a chip substrate surface and a discharge contribution terminal which is provided at the upper side on the chip substrate surface, and of which the height from the chip substrate surface to the top face is higher than the height of the top face of the fuse terminals.

Here the chip substrate surface refers to the surface of the substrate where a device chip is provided, and includes the surface of the isolation film if the latter surface appears at the former surface. The top face refers to the surface of the formed bumps. The height from the chip substrate surface to the top face of the electrode terminal refers to the height up to the highest position of the top face of the electrode terminal if the top face is not flat. The fuse terminal is an electrode terminal to be connected to a circuit which has a fuse (e.g. fuse for changing the resistance value of the variable resistance element).

According to the semiconductor device of the present invention, the top face of the discharge contribution terminal is formed to be higher than the top face of the fuse terminal, so when the device chip is mounted on a charged external substrate, the discharge contribution terminal contacts the terminal of the external substrate before the fuse terminal, and static electricity is discharged. When the fuse terminal contacts the terminal of the external substrate, static electricity has already been discharged, so the discharge of static electricity does not occur to the fuse terminal. Therefore electrostatic discharge damage of a semiconductor integrated circuit which has a fuse can be prevented.

Also all that is required is that the height from the substrate surface to the top face of the discharge contribution terminal is formed to be higher than the height from the substrate surface to the top face of the fuse terminal, so the fuse terminal does not need a new protective circuit, and the area occupied in the chip does not increase.

For producing the semiconductor device of the present invention, the fuse terminal is formed by directly layering a plurality of conductive layers sequentially and forming a bump on the top conductive layer. The discharged contribution terminal is formed by layering a plurality of conductive layers sequentially with inter-layer insulation film intervened, and forming a bump on the top conductive layer. The number of layers of the conductive layers in the fuse terminal and the number of layers of the conductive layers in the discharge contribution terminal are the same, and the conductive layers in the sample place in the fuse terminal and the discharge contribution terminal are formed in the same way with the same material.

According to the above mentioned method of producing the semiconductor device of the present invention, the conductive layers of the fuse terminal and the discharge contribution terminal are formed with the same material in the same way, except that the conductive layers of the fuse terminal are directly layered, so the height from the chip substrate surface to the top face of the discharge contribution terminal can be easily formed to be higher than the height from the chip substrate surface to the top face of the fuse terminal. Also since the general manufacturing steps are integrated with the manufacturing method of the semiconductor device, it is unnecessary to add a special step, and the present manufacturing method can be applied to a wide range of semiconductor integrated circuits.

BRIEF DESCRIPTION OF THE DRAWINGS

The foregoing and other objects, features and advantageous of the present invention will be better understood from the following description taken in connection with the accompanying drawings, in which.

DESCRIPTION OF THE PREFERRED EMBODIMENTS

With reference to the accompanying drawings, embodiments of the present invention will now be described. Each drawing merely shows the shape, size and positional relationship of each composing element sufficiently to help understand the present invention, and the present invention is not limited to the illustrated drawings. To make the drawings clear, hatching (diagonal lines) which indicate a cross-section may be omitted. Also in the following description, specific materials and conditions may be used, but these materials and conditions are one example, and the present invention is not limited by these. In each drawing, the same composing element is denoted with the same number, for which redundant description may be omitted.

First Embodiment

The semiconductor device according to the first embodiment of the present invention will now be described with reference to FIG. 1 and FIG. 2. In this embodiment, a silicon substrate is used for the chip substrate, the discharge contribution terminal is formed as the chip terminal, and is formed in the area where the fuse terminal and the chip terminal are adjacent to each other.

Figure 1:
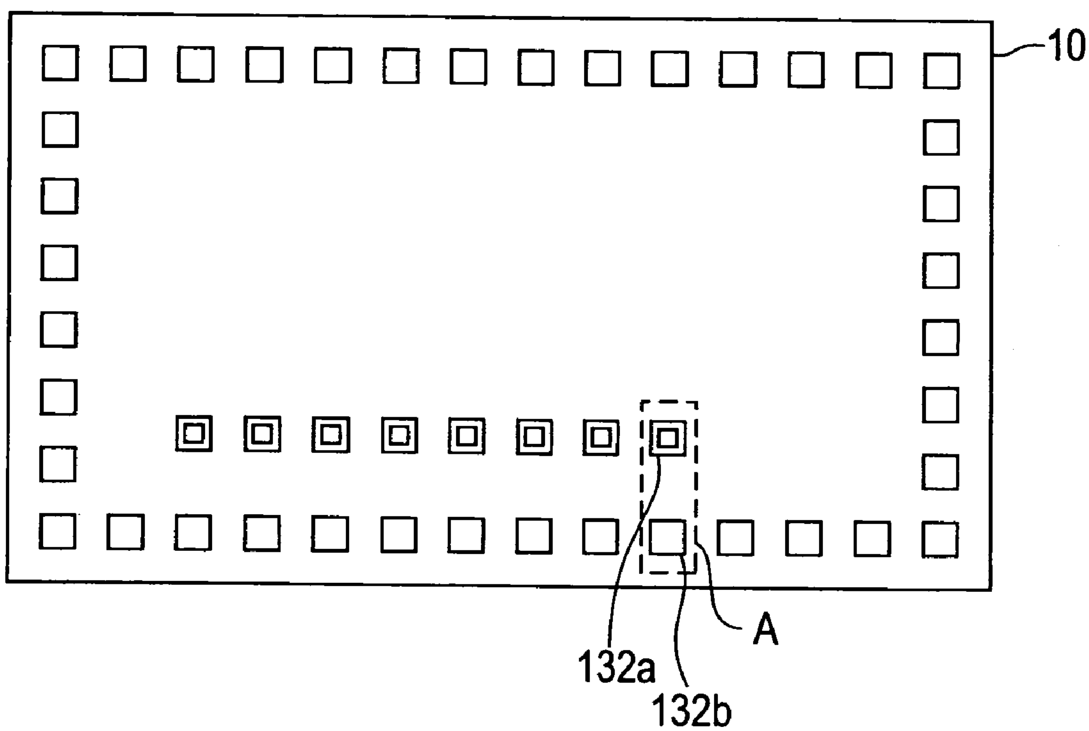
FIG. 1 is a diagram depicting the semiconductor device of the first embodiment according to the present invention.

FIG. 1 is a plan view of the device chip 10 of the first embodiment, which is viewed from the top. On the top surface of the device chip 10, bumps 132*a* of the fuse terminals and bumps 132*b* of the chip terminals are disposed. The bumps 132*a* of the fuse terminals are arranged in a line at the inner side of the device chip surface, and the bumps 132*b* of the chip terminals are arranged in a line at the outer side of the surface, along the edge of the device chip surface. In FIG. 1, the bump 132*a* of the fuse terminal is indicated by a double line square, and the bump 132*b* of the chip terminal is indicated by a single line square.

Figures 2A, 2B:
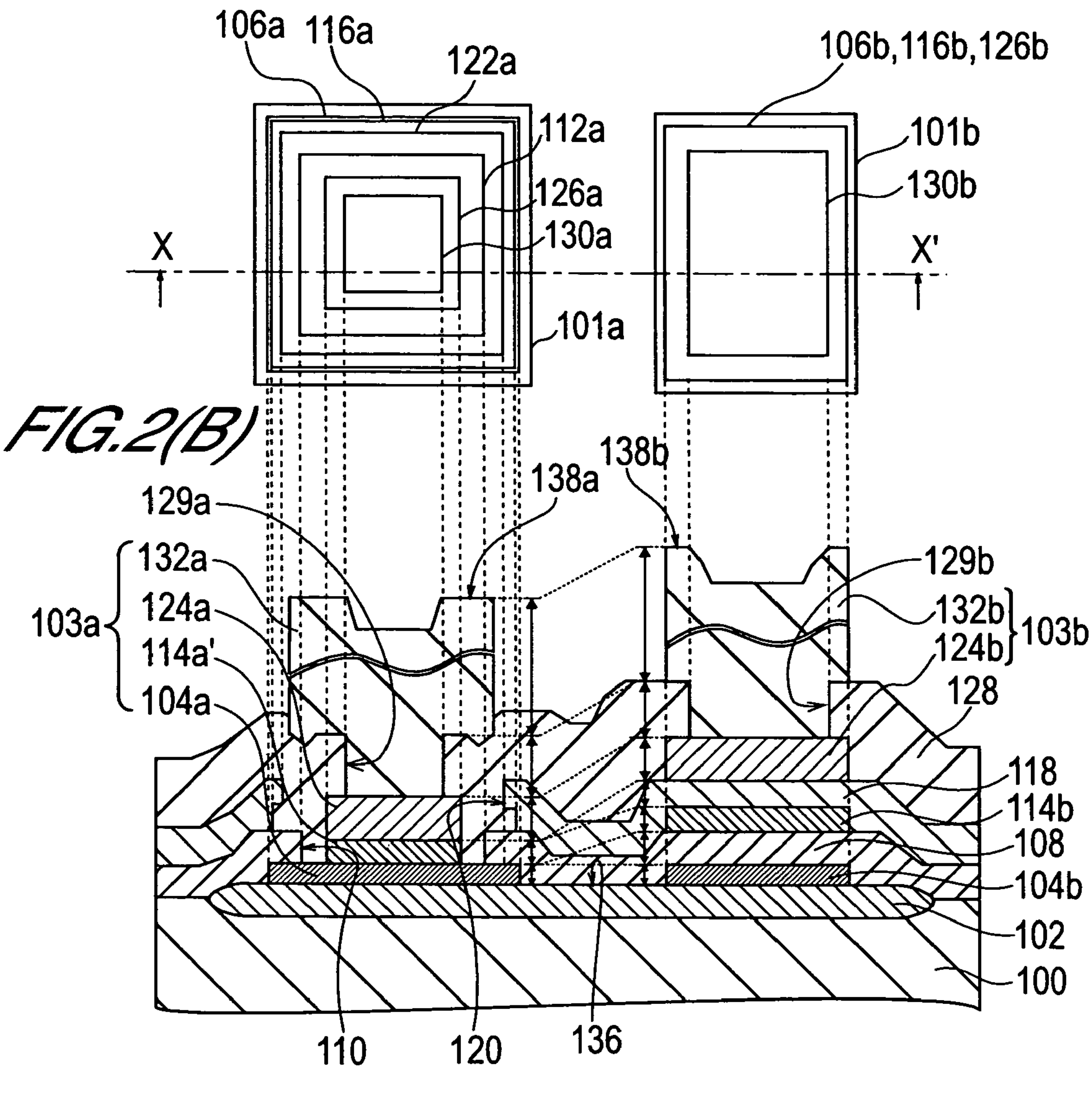
FIGS. 2 (A) and 2 (B) are diagrams depicting the structure of the semiconductor device of the first embodiment according to the present invention.
Figure 3A:
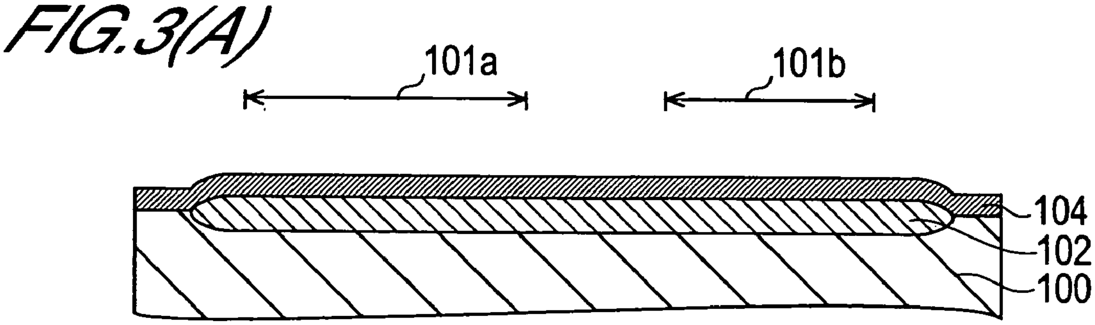
FIGS. 3 (A)–3 (E) are cross-sectional views depicting the manufacturing steps of the first embodiment according to the present invention.
Figure 3B:
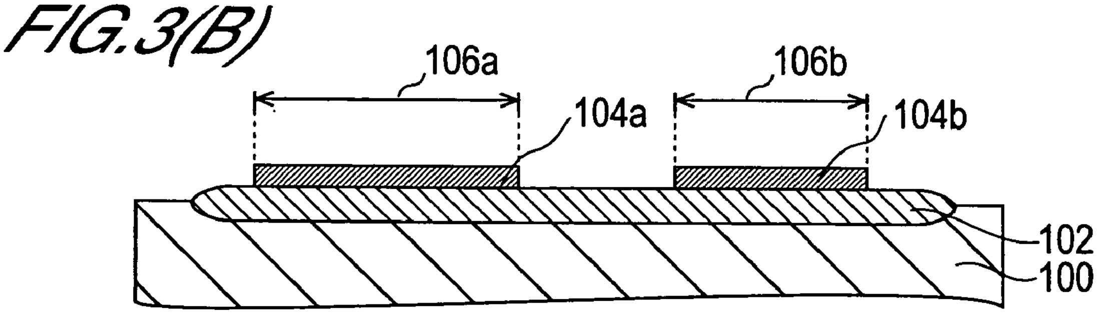
Figure 3C:
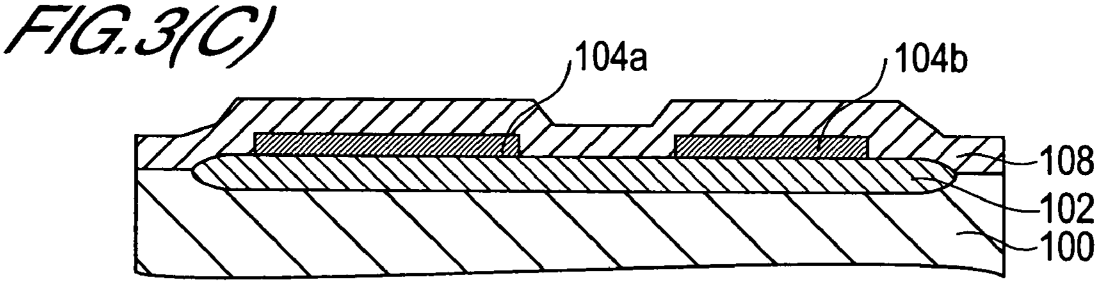
Figure 3D:
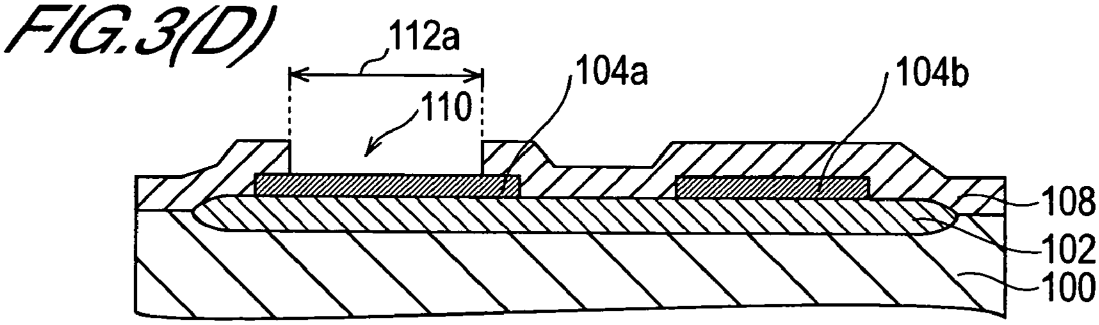
Figure 3E:
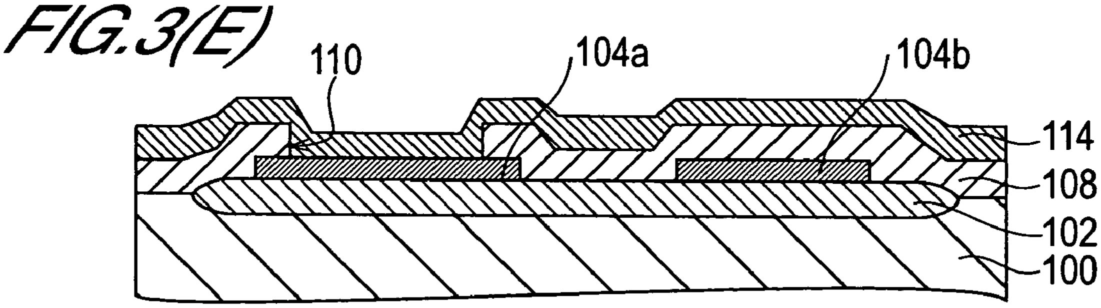
Figure 4A:
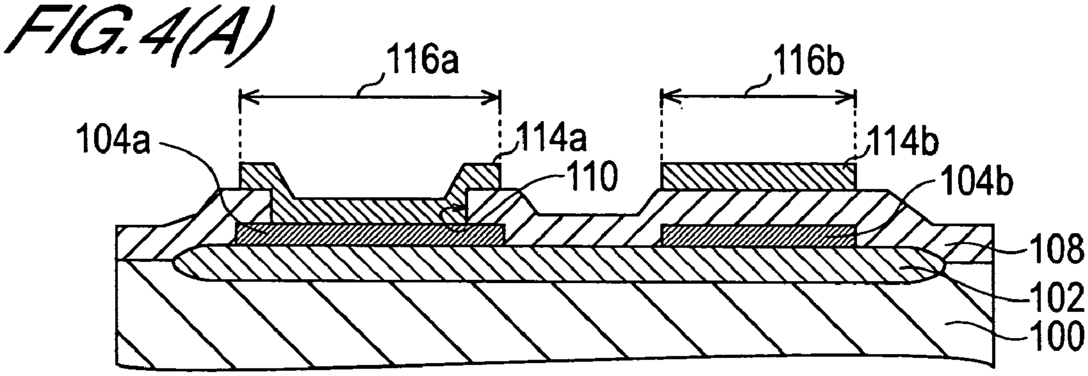
FIGS. 4 (A)–4 (D) are cross-sectional views depicting the manufacturing steps of the first embodiment according to the present invention.
Figure 4B:
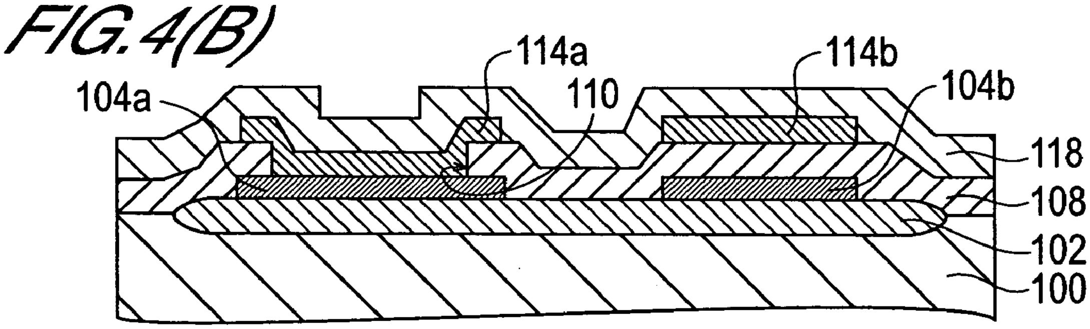
Figure 4C:
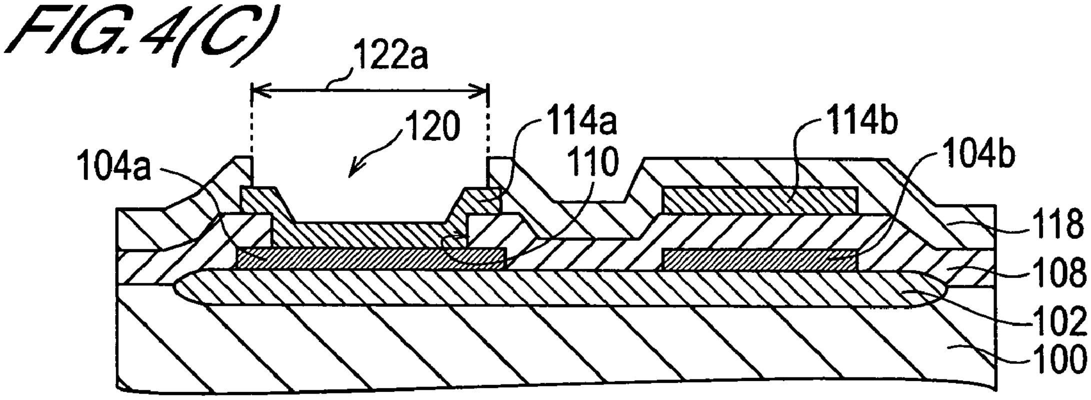
Figure 4D:
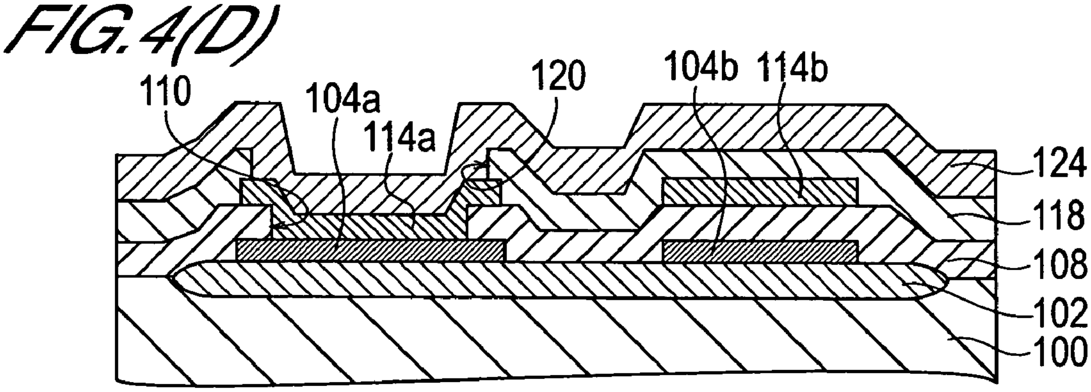
Figure 5A:
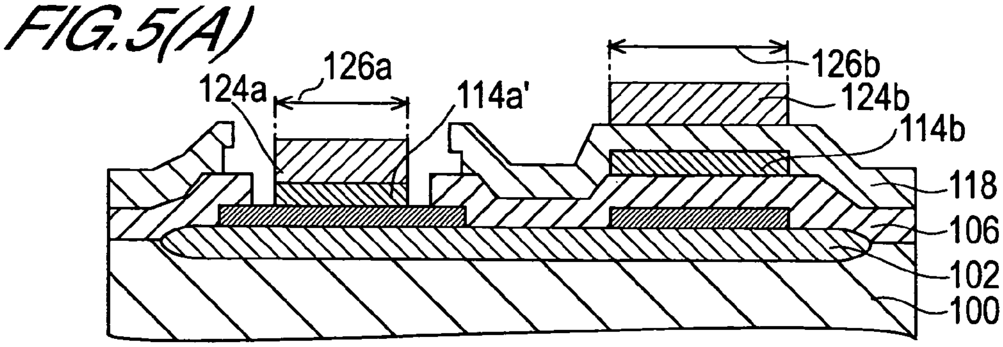
FIGS. 5 (A)–5 (D) are cross-sectional views depicting the manufacturing steps of the first embodiment according to the present invention.
Figure 5B:
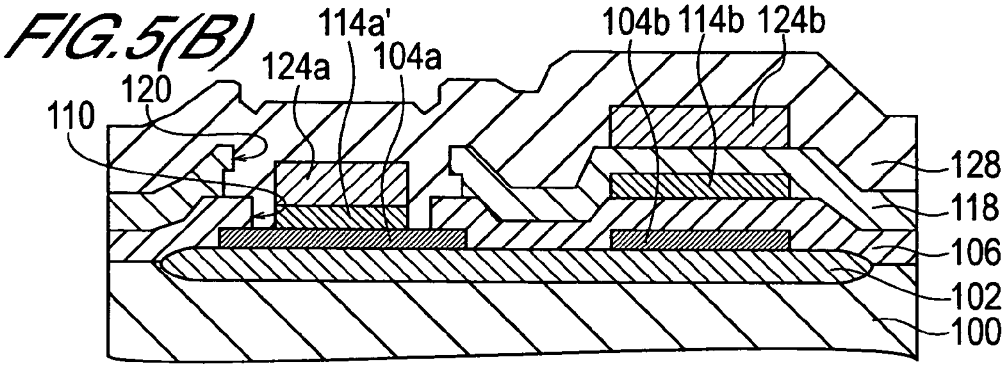
Figure 5C:
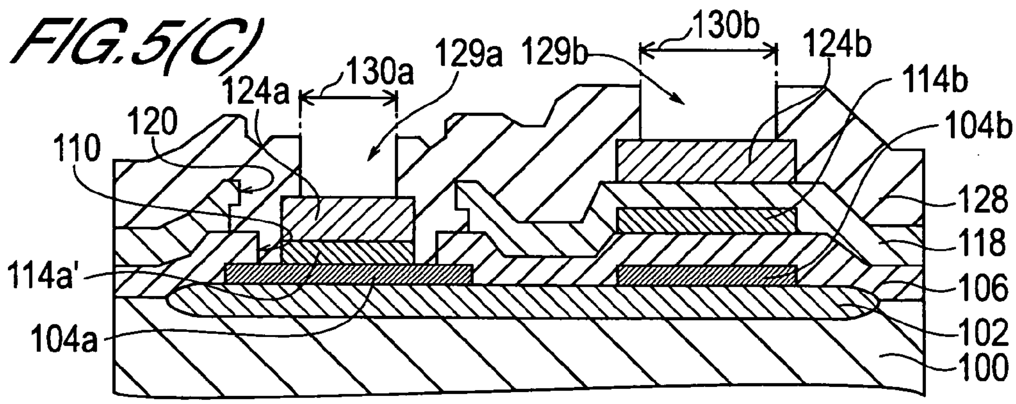
Figure 5D:
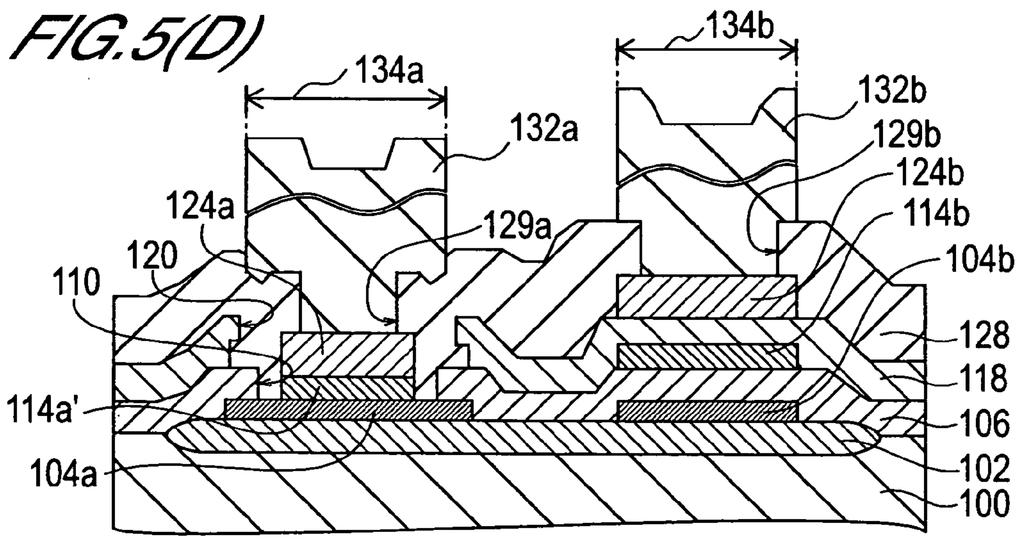

FIG. 2 (A) shows the layout of each layer film formation area and the opening area in the area A in FIG. 1 when the semiconductor device of the first embodiment is viewed from the upper side of the device. Only the range where one fuse terminal and one chip terminal are adjacent to each other is extracted and shown in the drawing of FIGS. 2 (A) and 2 (B).

In the fuse terminal formation area 101*a*, the polysilicon formation area 106*a* is set, and the first metal formation area 116*a* is set inside the polysilicon formation area 106*a*. The second opening area 122*a* is set inside the first metal formation area 116*a*, and the first opening area 112*a* is set inside the second opening area 122*a*. The second metal formation area 126*a* is set inside the first opening area 112*a*, and the protective film opening area 130*a* is set inside the second metal formation area 126*a*.

By setting each area as mentioned above, the first metal film is etched at the same time when the second metal film is etched, and is formed to be the same shape in the later mentioned manufacturing steps of this semiconductor device. In the etching process, the polysilicon film 104*a* plays the role of an etching stopper. As a result, the entire bottom face of the second metal film 124*a* is connected to the first metal film 114*a*' without forming an area where the second interlayer insulating film or interlayer dielectric 118 remains in the lower layer of the second metal film 124*a*, and the entire bottom face of the first metal film 114*a*' is connected to the polysilicon film 104*a* without forming an area where the first inter-layer insulation film 108 remains in the lower layer of the first metal film 114*a*'.

In the chip terminal formation area 101*b*, the polysilicon formation area 106*b*, the first metal formation area 116*b* and the second metal formation area 126*b* are set as the same area, and inside thereof, the protective film opening area 130*b* is set. The polysilicon formation area 106*b*, the first metal formation area 116*b* and the second metal formation area 126*b* are simply layered so as to be insulated via the first interlayer insulating film or interlayer dielectric 108 or the second interlayer insulating film 118, therefore these formation areas are the same size, but need not be.

FIG. 2 (B) is a cross-sectional view of FIG. 2 (A) taken along the broken line X–X'. On the surface of the silicon substrate 100, the field oxide film 102 is formed as the isolation area. In the fuse terminal formation area 101*a* and in the chip terminal formation area 101*b* on the field oxide film 102, the fuse terminal 103*a* and the chip terminal 103*b* are formed respectively.

In the chip terminal formation area 101*b*, the polysilicon film 104*b*, the first interlayer insulating film 108, the first metal film 114*b*, the second interlayer insulating film 118, the second metal film 124*b* and the protective film 128 are sequentially layered on the field oxide film 102. For the protective film 128, the protective film opening section 129*b* is formed therethrough at the protective film opening area 130*b* inside the second metal formation area 126*b*. The bump 132*b* is formed in the area which includes the protective film opening area 130*b* on the second metal film 124*b*. The chip terminal 103*b* is comprised of the second metal film 124*b* and the bump 132*b*.

In the fuse terminal formation area 101*a*, the polysilicon film 104*a*, the first interlayer insulating film 108, the first metal film 114*a*', the second interlayer insulating film 118, the second metal film 124*a* and the protective film 128 are sequentially layered on the field oxide film 102, just like the chip terminal formation area 101*b*. For the first interlayer insulating film 108, the first opening area 112*a* is opened, and the polysilicon film 104*a* and the first metal film 114*a*' are directly connected. For the second interlayer insulating film 118, the second opening area 122*a* is opened, and the first metal film 114*a*' and the second metal film 124*a* are directly connected. For the protective film 128, the protective film opening 129*a* is formed therethrough at the protective film opening area 130*a* inside the second metal formation area 126*a*. The bump 132*a* is formed in the area which includes the protective film opening area 130*a* on the second metal film 124*a*. The fuse terminal 103*a* is comprised of the polysilicon film 104*a*, the first metal film 114*a*', the second metal film 124*a* and the bump 132*a*.

The mid-portions of the bumps 132*a* and 132*b* are omitted in FIG. 2 (B), since the film thickness thereof is much thicker than that of other films.

The above mentioned polysilicon films 104*a* and 104*b*, the first metal films 114*a*' and 114*b*, and the second metal films 124*a* and 124*b* are all conductive films (also called conductive layers), and are formed by being isolated from a part of the respective interconnecting layer or from the interconnecting layer when the interconnecting layer is formed. In the configuration example described here, the polysilicon film 104*a*, the first metal film 114*a*', the second metal film 124*a* and the bump 132*a* constitute the fuse terminal, and the second metal film 124*b* and the bump 132*b* constitute the discharge contribution terminal which also functions as the chip terminal. The above mentioned configuration of the fuse terminal and the discharge contribution terminal is set in this way for explanation, and the conductive layers to be set as the fuse terminal and the discharge contribution terminal are not limited to the above description.

The fuse terminal 103*a* and the chip terminal 103*b* are electrically connected to the power supply wiring of the device chip by one of the above mentioned conductive layers.

As mentioned later, layered films which have a same name are formed simultaneously in the fuse terminal formation area 101*a* and the chip terminal formation area 101*b*, so they are formed to be the same film thickness.

Here it is assumed that the film thickness of the respective layered films are, polysilicon film: h1, first inter-layer insulation film: h2, first metal film: h3, second inter-layer insulation film: h4, second metal film: h5, protective film: h6 and bump: h7. The chip substrate surface 136 becomes the reference to compare the height of the top face of each terminal. In this example, the surface of the field oxide film 102 where each terminal is formed is used as the chip substrate surface 136 to be the reference. In FIG. 2 (B), the respective film thickness is indicated by the arrow marks. The height Hf of the fuse terminal 103*a*, from the chip substrate surface 136 to the top face 138*a*, is the sum of h1, h3, h5, h6 and h7, and the height Hc of the chip terminal 103*b*, from the chip substrate surface 136 to the top face 138*b*, is the sum of h1, h2, h3, h4, h5, h6 and h7. Since the height Hf of the fuse terminal does not include the film thickness h2 of the first interlayer insulating film and the film thickness h4 of the second interlayer insulating film, the height Hc of the chip terminal is higher for the amount of the sum of the film thickness h2 of the first interlayer insulating film and the film thickness h4 of the second interlayer insulating film.

Therefore when the COG type device chip 10 is approached to the external substrate (e.g. glass or ceramic substrate), which is easily charged, to be connected to external equipment, the chip terminal, which is formed to be higher than the fuse terminal, contacts the external substrate first. The static electricity charged on the external substrate is discharged via the protective circuit of the chip terminal. Therefore the discharge of static electricity does not occur to the fuse terminal, and electrostatic discharge damage of the fuse circuit can be prevented.

The manufacturing method of the semiconductor device according to the first embodiment of the present invention will now be described with reference to FIG. 3 to FIG. 5.

Field oxide film 102 is formed on the silicon substrate 100. This field oxide film 102 is formed by a known thermal oxidation method.

On the silicon substrate 100 which includes this field oxide film 102, the polysilicon film 104 for the interconnecting is formed (FIG. 3 (A)). This polysilicon film 104 is patterned by a known photolithography etching technology. The polysilicon film 104*a* is formed at the polysilicon formation area 106*a* inside the fuse terminal formation area 101*a*, and the polysilicon film 104*b* is formed at the polysilicon formation area 106*b* inside the chip terminal formation area 101*b* (FIG. 3 (B)).

Then the first interlayer insulating film 108 is formed with oxide film (film thickness 0.6 μm) by means of a CVD (Chemical Vapor Deposition) method, for example (FIG. 3 (C)).

In order to directly connect the polysilicon film 104*a* and the first metal film 114, the first opening 110 is formed. The first opening 110 is formed at the first opening area 112*a* of the first interlayer insulating film 108 by means of a known photolithography etching technology (FIG. 3 (D)). This opening 110 is set to be an area smaller than the first metal formation area 116*a* and the second opening area 122*a*.

The first metal film 114 for the interconnection is formed with aluminum (Al) (film thickness 0.5 μm) by means of a sputtering technique, for example (FIG. 3 (E)).

The first metal film 114 is patterned by a known photolithography etching technology. At the first metal formation area 116*a* in the fuse terminal formation area, the first metal film 114*a* is formed, and at the first metal formation area 116*b* in the chip terminal formation area, the first metal 114*b* is formed (FIG. 4 (A)).

The second interlayer insulating film 118 is formed with oxide film (film thickness 0.6 μm) by means of a CVD (Chemical Vapor Deposition) method, for example (FIG. 4 (B)).

In order to directly connect the first metal film 114*a* and the second metal film 124, the second opening 120 is formed at the second opening area 122*a* of the second interlayer insulating film 118 (FIG. 4 (C)).

The second metal film 124 for the interconnection is formed with aluminum (Al) (film thickness 1 μm) by means of a sputtering, for example (FIG. 4 (D)).

The second metal film 124 is patterned by a known photolithography etching technology. At the second metal formation area 126*a* in the fuse terminal formation area, the second metal film 124*a* is formed, and the second metal 124*b* is formed at the second metal formation area 126*b* in the chip terminal formation area. At this etching process, the first metal film 114*a* in the fuse terminal formation area is also etched to obtain the first metal film 114*a*', the size of which is the same as the size of the second metal film 124*a* (FIG. 5 (A)). If wet etching using HF (hydrofluoric acid) is used, the first metal film under the second interlayer insulating film 118 is etched.

Next, the protective film 128 is formed with oxide film (film thickness 2 μm) by means of a CVD method (FIG. 5 (B)).

Next, the protective film openings 129*a* and 129*b* are formed at the protective film opening areas 130*a* and 130*b*, respectively, by means of a photolithography etching technology (FIG. 5 (C)).

Next, the metal film is formed at the bump formation areas 134*a* and 134*b* (not illustrated). This metal film is formed to improve the adhesion of bumps which are formed by a plating method. As the material of the metal film, an alloy of titanium (Ti) and a high melting point metal (e.g. tungsten (W), palladium (Pd)) are used. The bump formation areas 134*a* and 134*b* are set to be areas which are larger than the protective film opening areas 130*a* and 130*b*.

By means of a plating method, the bumps 132*a* and 132*b* are formed on the metal film using gold (Au) or solder (film thickness 50 μm) (FIG. 5 (D)). In FIG. 5 (D) as well, the mid-portions of the bumps 132*a* and 132*b* are omitted, just like FIG. 2 (B).

By the above manufacturing steps, the semiconductor device of the first embodiment of the present invention is obtained. In other words, the device chip 10, where the height from the substrate surface to the top face of the chip terminal is higher than the height from the substrate surface to the top face of the fuse terminal, is formed. Also the shapes of the second metal film 124*a* and the first metal film 114*a*' are easily formed to be the same because the first metal 114*a* for the fuse terminal and the second metal film 124 is etched during the one and same etching process.

As is apparent from the above description, the chip terminal contacts the external substrate before the fuse terminal does so when the device chip is connected with the external equipment, since the height from the substrate surface to the top face of the chip terminal is higher than the height from the substrate surface to the top face of the fuse terminal. Therefore, the static electricity charged on the external substrate is absorbed by the protective circuit in the chip terminal. The in-flow of the electrostatic surge ends when the potential of the external equipment and the semiconductor chip become the same, that is, when the amount of electric charges to be charged in the electrostatic capacity (about several pF to several tens of pF) is supplied from the equipment side, so the time required for discharge is several tens of picoseconds to at the most several nanoseconds. Discharge ends in at most several nanoseconds after the chip terminal contacts the external substrate, static electricity has already been discharged, and external equipment and the device chip have become the same potential when the fuse terminal contacts the external equipment. Therefore the fuse terminal is not influenced by the discharge of static electricity, that is, electrostatic discharge damage does not occur.

The height Hf from the substrate surface to the top face of the fuse terminal becomes lower by connecting the polysilicon film, first metal film and second metal film directly without intervening the first interlayer insulating film and the second interlayer insulating film. As a result, the height Hc from the substrate surface to the top face of the chip terminal is formed higher than the height Hf of the surface of the fuse terminal, so an increase of the new area occupied in the chip is not required. Therefore compared with the case when a new protective circuit for a fuse terminal is formed, no major design change is required, and the same degree of integration is maintained.

Second Embodiment

Figure 6:
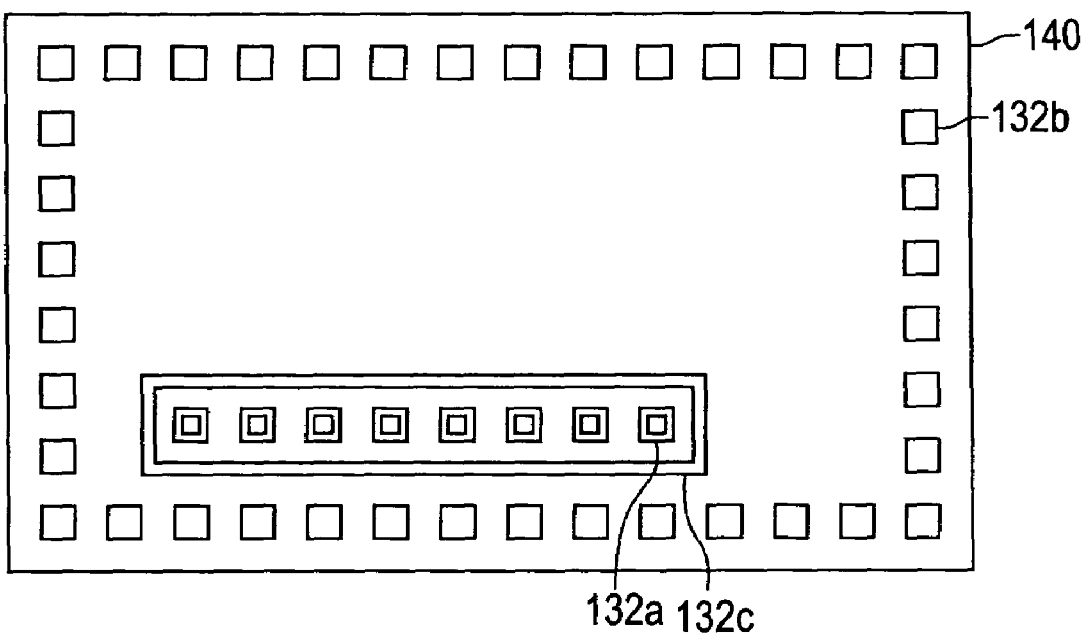
FIG. 6 is a diagram depicting the semiconductor device of the second embodiment according to the present invention.

FIG. 6 is a drawing schematically depicting the device chip 140 of the second embodiment viewed from the upper side of the device chip.

Just like the first embodiment, bumps 132*b* of the chip terminals are formed on the surface of the device chip 140 along the edge, and the bumps 132*a* of the fuse terminals are formed at the inner side of the area where bumps 132*b* of the chip terminals are formed. In the second embodiment, the bumps 132*c* of the dummy terminal are formed around the fuse terminals as a discharge contribution terminal. The bumps 132*c* of the dummy terminal for fuse protection are formed so as to surround the bumps 132*a* of the fuse terminals like a frame.

Figure 7A:
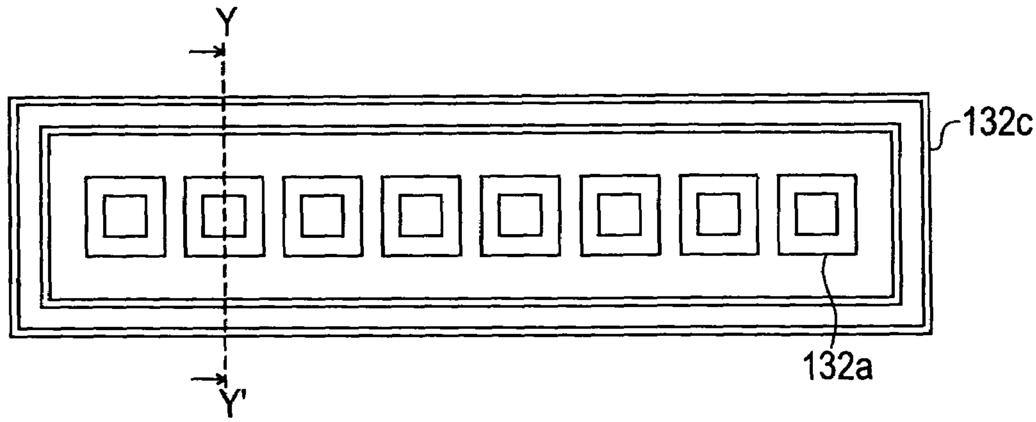
FIGS. 7 (A) and 7 (B) are diagrams depicting the structure of the semiconductor device of the second embodiment according to the present invention.
Figure 7B:
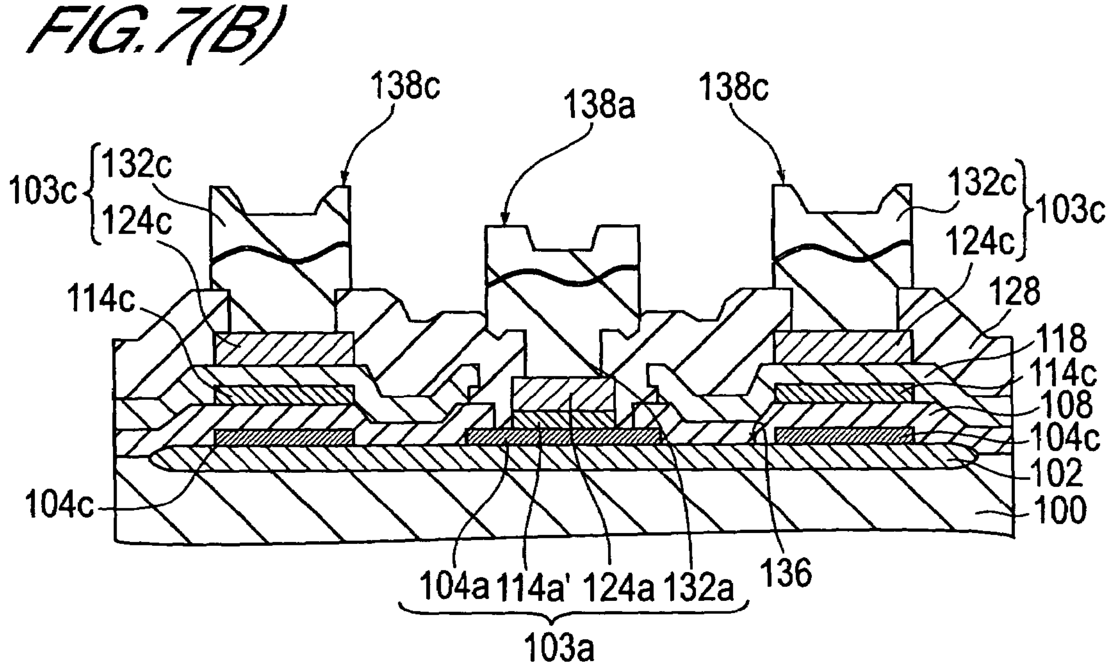

FIG. 7 (A) is an enlarged view of the area where the bumps 132*a* of the fuse terminals and the bumps 132*c* of the dummy terminal are formed as shown in FIG. 6. Surrounding the bumps 132*a* of the plurality of fuse terminals lined up in a line, like a frame, the bumps 132*c* of the dummy terminal are formed.

FIG. 7 (B) is a cross-sectional view of FIG. 7 (A) taken along the broken line Y–Y'. The fuse terminal 103*a* has the same layered structure as that of the first embodiment. In other words, the polysilicon film 104*a*, the first metal film 114*a*' and the second metal film 124*a* are sequentially layered on the field oxide film 102, and the bumps 132*a* are formed in the area including the opening formed through the protective film 128 formed on the second metal film 124*a*. The dummy terminal 103*c* is formed surrounding the fuse terminals 103*a* arranged in a line, like a frame, when the layer structure shown in FIG. 7 (B) is viewed from the upper side of the device chip, but has the same layered structure as the chip terminal of the first embodiment. In other words, the polysilicon film 104*c*, the first interlayer insulating film 108, the first metal film 114*c*, the second interlayer insulating film 118, and the second metal film 124*c* are sequentially layered on the field oxide film 102, and the bumps 132*c* are formed in the area including the opening formed on the second metal film 124*c*. The surface of the bumps 132*c* is the top face 138*c*, and the height is compared at the highest position of the top face. In the fuse terminal 103*a*, the first interlayer insulating film 108 and the second interlayer insulating film 118 are not layered, just like the first embodiment. Therefore the height of the dummy terminal 103*c* from the chip substrate surface 136 to the top face 138*c* is higher than the height of the fuse terminal 103*a* from the chip substrate surface 136 to the top face 138*a* for the amount of the thickness of the two interlayer insulating films. In the first embodiment, the discharge contribution terminal is a chip terminal, so the discharge contribution terminal is electrically connected to the power supply line of the device chip by one conductive layer of the polysilicon film 104*b*, the first metal film 114*b* and the second metal film 124*b*. In the second embodiment, the discharge contribution terminal is a dummy terminal, so it is not electrically connected to the power supply line of the device chip.

In this way, by surrounding the bumps 132*a* of the fuse terminals with the bumps 132*c* of the dummy terminals, not the fuse terminals but the adjacent dummy terminal contacts the surface of the external equipment first when the device chip is connected to the external equipment, even if the substrate is contacted in an inclined status with respect to the surface of the external equipment. When the bumps 132*c* of the dummy terminals contact the external substrate, the dummy terminal and the external substrate to be connected become the same potential. Therefore even if the external substrate is charged, the dummy terminal always discharges first, so the electrostatic discharge damage of the fuse terminals can be prevented.

Figure 8:
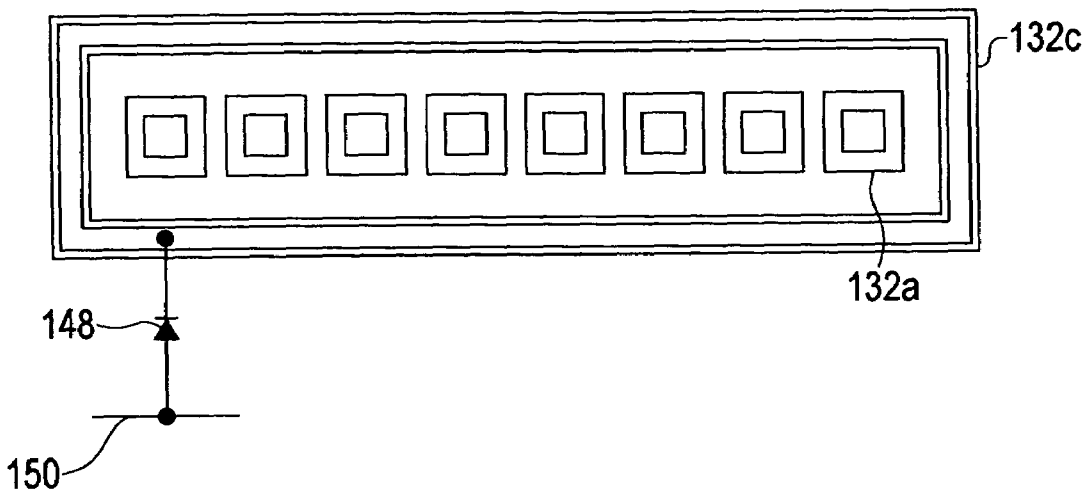
FIG. 8 is a diagram depicting a variant form of the semiconductor device of the second embodiment of the present invention.
Figure 10:
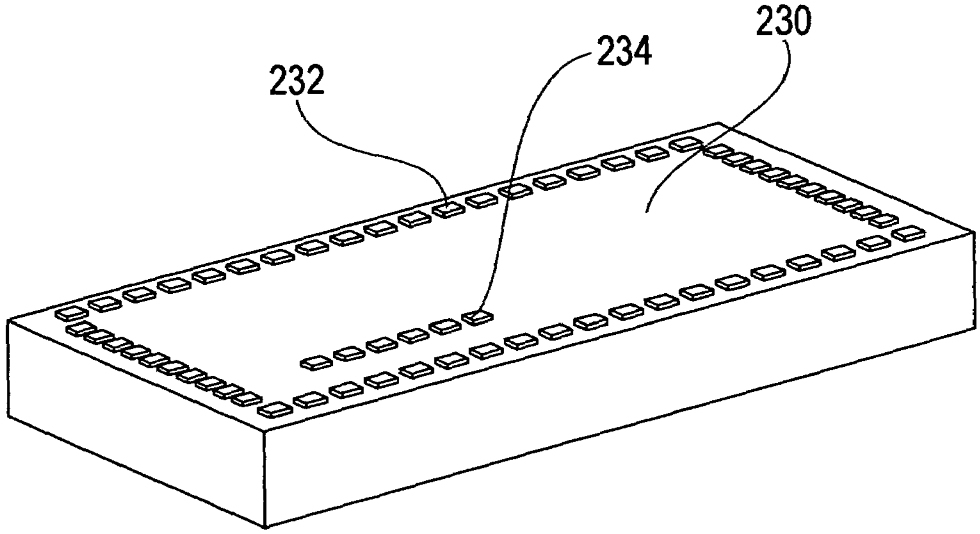
FIG. 10 is a diagram depicting a general COG package.
Figure 9A:
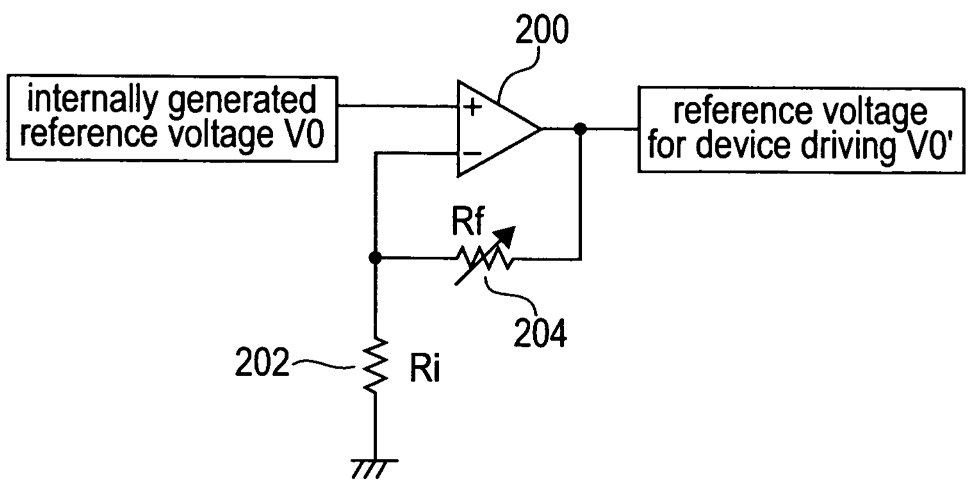
FIGS. 9 (A) and 9 (B) are diagrams depicting an example of an amplification circuit which has a fuse.
Figure 9B:
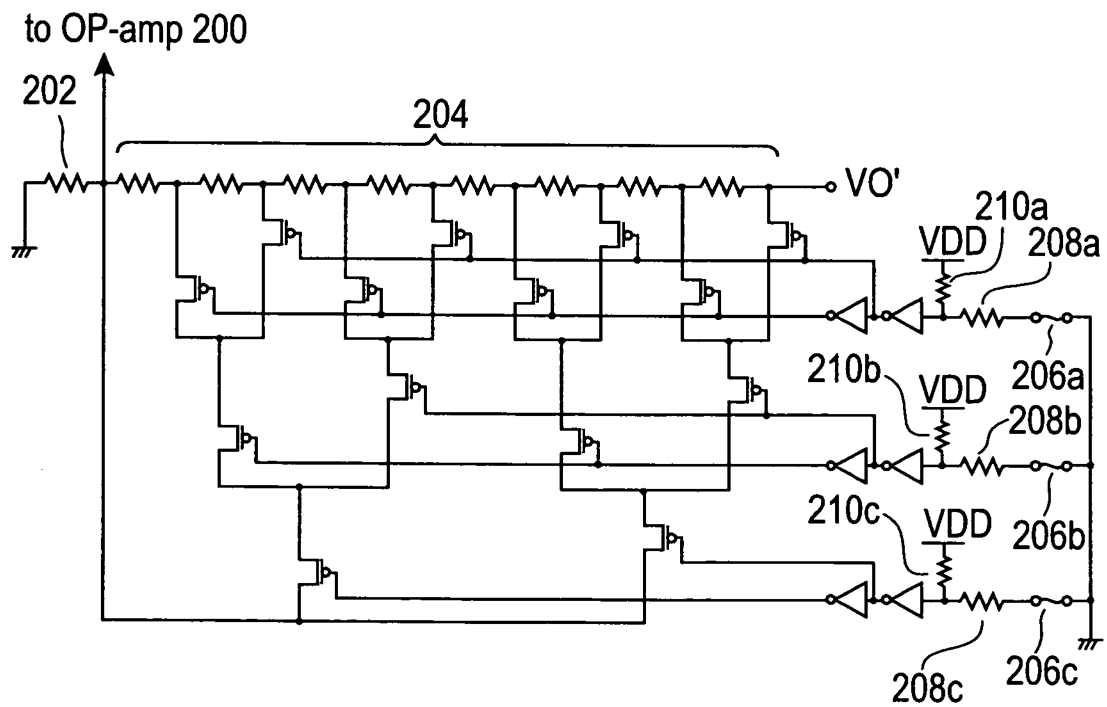
Figure 11:
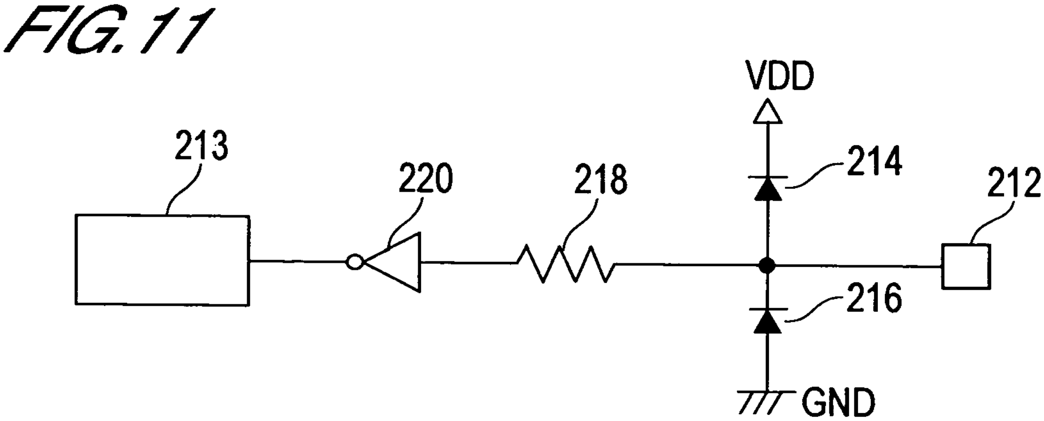
FIG. 11 is a circuit diagram depicting a general protective circuit.
Figure 12:
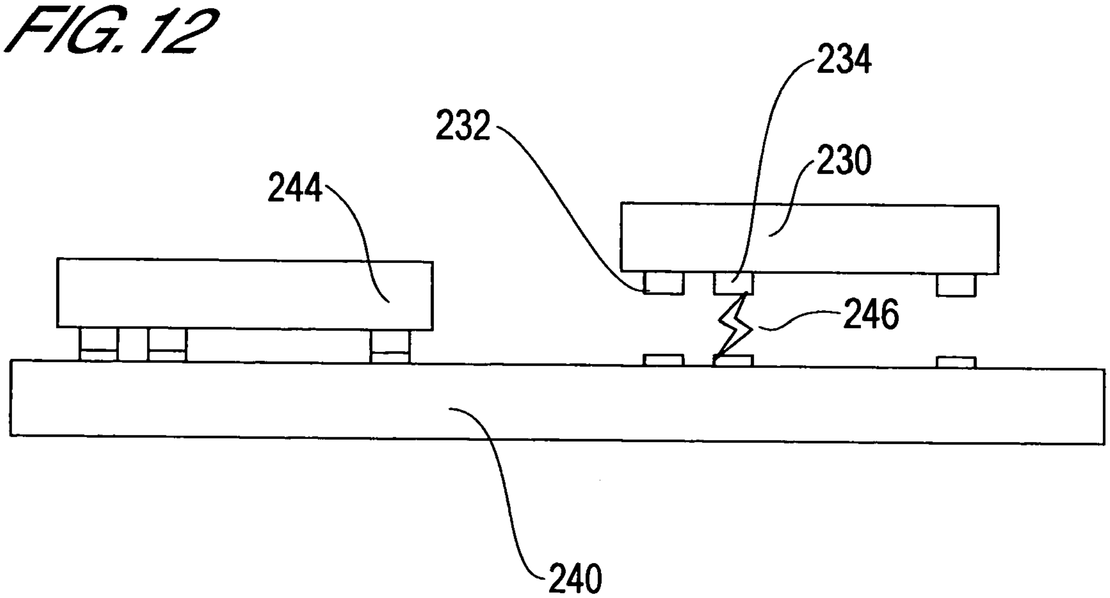
FIG. 12 is a schematic depicting the electrostatic discharge phenomena in the COG packaging step.

FIG. 8 is a variant form of the second embodiment, where the dummy terminal is electrically connected to the power supply wiring 150 for supplying the reference voltage of the device chip via the protective element 148. The dummy terminal is electrically connected to the power supply wiring 150 of the device chip via the protective element 148 by the first metal film 114*c* or the second metal film 124*c*. In this case, when the discharge of static electricity is caused by contacting with an external substrate, the static electricity is discharged to the power supply wiring via the protective element 148 for certain, which makes the external equipment and the substrate the same potential, so the fuse terminals can be protected from electrostatic discharge damage with further certainty.

Here the protective element 148 is made of a diode as an example, but the protective element generally used, such as another element like a transistor, may be used.

In the above embodiment, the case when the number of interconnecting layers, that is metal films, in the multi-layer type interconnecting layer is two, the first and second metal films was described. If the number of layers of the metal films is not two but more, the number of layers of the interlayer insulating films also increases. Therefore the total of film thickness of each interlayer insulating film increases in proportion to the number of layers of the interlayer insulating films, and the difference of heights between the fuse terminal and the chip terminal, from the substrate surface to the top face, also increases. For example, if the number of layers of the metal films is three, a third opening section similar to the first and second opening sections is formed in the third interlayer insulating film (insulation film formed between the second metal film and the third metal film) of the fuse terminal formation area, and the third metal film and the second metal film are directly connected, then the film thickness of the third interlayer insulating film layered this time is added to the difference of height of the top face between the fuse terminal and the chip terminal. Therefore if the fuse terminals are formed such that the metal films of the fuse terminal are directly connected, the difference of height of the top face between the fuse terminal and the chip terminal increases as the number of layers of the metal films increases, and the static electricity is discharged to the chip terminal with further certainty.

Each interlayer insulating film may be formed by CVD and then planarized by CMP (Chemical Mechanical Polishing). In the above embodiment, the number of layers of the metal films for multi-layer type interconnection is two, so the step difference of layered films is not very big, and planarization by CMP is hardly necessary. However when the number of layers of the metal layers is higher (generally four or more layers), planarization by CMP is executed after each interlayer insulating film is formed, so as to smooth the step difference. The present invention can also be applied to this CVD technology. In this case, it is preferable that the film thickness of the interlayer insulating film to be formed by CVD is set to 2–3 times the film thickness of the interlayer insulating film to remain after CMP, considering the film thickness to be decreased by CMP.

According to the semiconductor device of the present invention, the top face of the discharge contribution terminal is formed to be higher than the top face of the fuse terminal, so the discharge contribution terminal contacts first before the fuse terminals, and static electricity is discharged when the device chip is mounted to the charged external substrate. When the fuse terminals contact the terminals of the external substrate, static electricity has already been discharged, so an electrostatic discharge does not occur to the fuse terminals. Therefore electrostatic discharge damage of the semiconductor integrated circuit which has fuses can be prevented.

Since the height of the discharge contribution terminal from the substrate surface to the top face is simply formed to be higher than the height of the fuse terminal from the substrate surface to the top face, it is unnecessary to form a new protective circuit for the fuse terminals, and the area occupied in the chip does not increase.

According to the manufacturing method of the above mentioned semiconductor device, the films of the fuse terminal are deposited with the same material in the same way as the discharge contribution terminal, except the conductive layers of the fuse terminals are directly layered, so the height of the discharge contribution terminal from the chip substrate surface to the top face can be easily formed to be higher than the height of the fuse terminal from the chip substrate to the top face. Also general manufacturing steps are integrated, so it is unnecessary to add a special step, and this method can be applied to semiconductor integrated circuits in a wide range.

What is claimed is:

1. A semiconductor device, comprising:

exposed fuse terminals provided adjacent a chip substrate surface; and an exposed discharge contribution terminal which is provided adjacent said chip substrate surface;

wherein a first height, from said chip substrate surface to a top face of said discharge contribution terminal, is higher than a second height, from said chip substrate surface to a top face of said fuse terminals.

2. The semiconductor device according to claim 1, wherein said discharge contribution terminal is a chip terminal.

3. The semiconductor device according to claim 1, wherein said discharge contribution terminal is a dummy terminal which is disposed so as to surround the fuse terminals.

4. The semiconductor device according to claim 1, comprising a protective circuit, and wherein said discharge contribution terminal is connected to said protective circuit.

5. The semiconductor device according to claim 4, wherein said dummy terminal is electrically connected to a reference voltage power supply.

6. The semiconductor device according to claim 1, wherein said fuse terminals and said discharge contribution terminal comprise respective bumps that are disposed on a top surface of said semiconductor device.

7. A semiconductor device, comprising:

fuse terminals provided on a chip substrate surface; and a discharge contribution terminal which is provided at the upper side on said chip substrate surface and of which the height from said chip substrate surface to the top face is higher than the height of the top face of said fuse terminals;

wherein said discharge contribution terminal is a dummy terminal which is disposed so as to surround the fuse terminals.

8. The semiconductor device according to claim 7, wherein said dummy terminal is electrically connected to a reference voltage power supply.

* * * * *